US006232619B1

(12) United States Patent
Chen et al.

(10) Patent No.: US 6,232,619 B1
(45) Date of Patent: May 15, 2001

(54) DOSAGE MICRO UNIFORMITY MEASUREMENT IN ION IMPLANTATION

(75) Inventors: Chien-Fong Chen, Taichung; Yao-Yu Lee, Chia-Yi, both of (TW)

(73) Assignee: Taiwan Semiconductor Manufacturing Company, Hsin-chu (TW)

(*) Notice: Subject to any disclaimer, the term of this patent is extended or adjusted under 35 U.S.C. 154(b) by 0 days.

(21) Appl. No.: 09/604,063

(22) Filed: Jun. 26, 2000

Related U.S. Application Data

(62) Division of application No. 09/133,973, filed on Aug. 14, 1998, now Pat. No. 6,107,108.

(51) Int. Cl.[7] .................................................. H01L 23/58
(52) U.S. Cl. ............................. 257/48; 257/202; 257/204
(58) Field of Search ............................... 257/48, 202, 204, 257/206, 210, 211

(56) References Cited

U.S. PATENT DOCUMENTS

| | | | |
|---|---|---|---|
| 4,472,871 | * 9/1984 | Green et al. ............................ | 29/571 |
| 4,570,070 | 2/1986 | Tabei ..................................... | 250/372 |
| 5,082,792 | 1/1992 | Pasch et al. ........................... | 437/170 |
| 5,179,433 | * 1/1993 | Misawa et al. ........................ | 257/48 |
| 5,422,490 | 6/1995 | Nakamura et al. .................... | 250/492.21 |
| 5,432,352 | 7/1995 | van Bavel .............................. | 250/492.21 |
| 5,451,529 | 9/1995 | Hsu et al. ............................... | 437/8 |
| 5,574,280 | 11/1996 | Fujii et al. .............................. | 250/309 |

* cited by examiner

*Primary Examiner*—Nathan Flynn
*Assistant Examiner*—Remmon R. Fordé
(74) *Attorney, Agent, or Firm*—George O. Saile; Stephen B. Ackerman

(57) ABSTRACT

A design of a test chip for determining the dopant uniformity of an ion implantation within a area of the order of several tens of microns is disclosed and a method for it's measurement provided. The object of the test chip is particularly adapted to sense dopant concentration variations caused by the variation of density in the spot of the ion implantation beam and can be used to determine optimal overlap of adjacent beam scans. The test chips use arrays of MOSFETs arranged in a pattern with channel lengths parallel to the path of the ion implantation beam and provide a contiguous set of incremental concentration measurements across the paths of the ion implantation beam scans. The gate threshold voltages are measured and related to the active dopant impurity concentration in the channel area. The width of the concentration increment is therefore equal to the channel length. The magnitude and the long range uniformity of active dopant impurity can be determined over a large portion of the wafer or, with a high resolution, over a relatively small area with magnitude of device dimensions.

5 Claims, 8 Drawing Sheets

DOSAGE MICRO UNIFORMITY MEASUREMENT IN ION IMPLANTATION

This is a division of patent application Ser. No. 09/133,973, filing date Aug. 14, 1998 now U.S. Pat. No. 6,107,108, Dosage Micro Uniformity Measurement In Ion Implantation, assigned to the same assignee as the present invention.

BACKGROUND OF THE INVENTION (1) Field of the Invention

The invention relates to processes for the manufacture of semiconductor devices and more particularly to processes relating to the ion implantation of dopant impurities into a semiconductor wafer.

(2) Description of Prior art and Background to the Invention

The predominantly used method for the incorporation of dopant impurities into semiconductor wafers for the formation of semiconductive devices such as field effect transistors(FETs) and bipolar junction transistors(BJTs) is ion implantation. A focused beam of ions is generated in an apparatus called an ion implanter. The beam is produced by ionizing molecules or atoms in a source gas and then electrostatically collimating, filtering to exclude unwanted ions, and focusing the beam onto the target wafer surface. The focused beam, which ideally has a uniform radial density and spot size, is scanned across the wafer surface in a raster pattern so that the entire useable surface of the wafer is momentarily exposed to the beam. The ions are driven into (implanted) into the wafer surface. The depth to which they are implanted is dependent upon their energy within the beam. The dosage implanted depends upon the ion density in the beam and the time of exposure of an element of wafer surface area to the beam.

The actual density of ions is not uniform across the cross section of the focused beam which forms the spot. Consequently the implanted dosage varies from the center of the line of travel of the scan to the edge. In addition, for a scan performed by a circular spot, the instantaneous exposure of the scan line is greater at the center than at the edge. Consequently, the dosage of the resultant implant is greater at the center of the scan line than at the edges. In practice, the raster is programmed to provide an overlap between adjacent scan lines to overcome radial dosage non-uniformity and to assure continuous coverage. Scanning the wafer alternately in one direction and then in a direction orthogonal to the first improves the doping uniformity. Subsequent thermal processing also adds a further smoothing of the dopant profile. However, a shadow of the scanning raster is still retained, manifesting doping nonuniformities within areas of the order of tens of microns. Non-uniform ion densities within the beam or an unstable ion beam caused by tool contamination and tuning degradation can create impurity concentration variations on a more local scale causing variation of characteristics between adjacent devices. The angle of incidence of the beam on the wafer is also critical because of the channeling effect which is related to the crystalline orientation of the wafer. When a large wafer is scanned by a single ion beam, the angle of incidence must be maintained constant by tilting the wafer.

The effects of variations in the dopant profile become significant when the planar dimensions of the semiconductive elements shrinks to below the sub-half micron level and device performance becomes more crucially dependent upon dopant uniformity. This is of particular importance for ion implantations which are used for threshold voltage adjustment of MOSFETs (Metal oxide semiconductor field effect transistors).

Because of the manner in which the wafer is scanned it would be expected that the non-uniformity of the dopant profile would exhibit a periodic behavior, related to the scanning pattern. However, what is observed is that the dopant profile is more complex and not as predictable as would be expected from mere periodic considerations. It therefore becomes imperative to devise a method, not only to monitor the dopant distribution for process control but also to enable a better understanding of the mechanisms which affect it. The understanding of dopant uniformity becomes more important as device scaling extends to 0.25 microns and beyond because fewer and fewer charges are involved in forming the conducting channel necessitating the use of very high energy and very low beam current ion implanters.

Current methods for monitoring or measuring the uniformity of ion implant dosage are limited to the measurement of sheet resistance, capacitance voltage measurements and thermal wave measurements. These measurements are limited to determining average dosages over regions much larger than the dimensions of the scan lines patterns or of the implanted regions of the implant regions of small area devices. Non-uniformities in dopant depth and lateral concentration which occur because of improper scanning overlap, or channeling may extend over regions containing several devices. These non-uniformities result in significant variation in the performance of the devices. The current methods are incapable of measuring implanted wafer surfaces with fine enough resolution to reveal these dopant variations.

Pasch, et.al. U.S. Pat. No. 5,082,792 show a method for altering the resistance of a diffused region of a substrate through a contact hole in an insulating layer. The change in resistance is then used to determine the size of the hole. The invention does not address measurement of ion implanted impurity profiles in the wafer. Hsu, et.al, U.S. Pat. No. 5,451,529 shows a method for real time monitoring of ion implantation doses by measurement of the sheet resistance of a metal silicide monitor with a four point probe. The method does not have the resolution required to observe variations across ion implant beam scans. Ban Vavel, U.S. Pat. No. 5,432,352, Nakamura, et.al., U.S. Pat. No. 5,422,490, and Fujii, et.al., U.S. Pat. No. 5,574,280 show methods of ion beam control for ion implantation but do not show means for measuring implantation uniformity. Tabei, U.S. Pat. No. 4,570,070 show a method for monitoring the intensity of an ion beam by scanning a flat pellet of $Al_2O_3$ with the ion beam and detecting the ultraviolet light emitted by the pellet.

SUMMARY OF THE INVENTION

It is an object of this invention to provide designs for test structures for determining the dopant distribution or uniformity of an ion implantation and a method for their formation and measurement.

It is another object of this invention to provide a design for a test pattern for determining the magnitude and the uniformity of resistivity of a semiconductor surface within a area of the order of several tens of microns and a method for it's measurement It is yet another object of this invention to provide a design for and method of use of test structures for in-line monitoring and determining the condition of an ion implanter.

It is yet another object of this invention to provide a test chip design and method of measurement to indicate the type of remedial action required to restore an ion implanter to optimum condition.

It is another object of this invention to provide a design and method of measurement of test structures to ascertain the dimensions and characteristics of an ion implanter beam.

It is yet another object of this invention to provide a test chip design and method for measuring the dopant profile produced by overlapping adjacent ion implantation beam paths in order to determine the amount of beam overlap required to optimize the resultant doping uniformity.

These objects are accomplished by the use of a set of a MOSFET test structures which are aligned with the scanning paths followed by the ion implanter. Typical ion implanters are aligned to scan along paths parallel to and perpendicular to the wafer flat which corresponds to a major crystallographic direction of the wafer. Accordingly the test chip comprises two groups of MOSFETs, each group consisting of a plurality of arrays of MOSFETs of varying channel lengths. The MOSFETs in one group have their channel directions oriented parallel to the wafer flat, and those in the other group have their channels directions oriented perpendicular to the wafer flat.

Each array in each group consists of columns and rows of MOSFETs of a single channel length arranged in a pattern whereby the left side of the channel of one device aligns with the right side of the channel of the next lower device in same column. The channel of the device in the last row of the first column aligns with the channel of the device in the first row of the next adjacent column. In this way the entire region between adjacent ion beam scans is covered by a MOSFET channel in both scanning directions of the ion implantation beam.

The gate threshold voltage ($V_T$) of the MOSFETs is used as a measure of the dopant concentration within the channel region. The ion implant dosage can therefore be mapped over regions of the wafer in increments significantly smaller than the spot size of the implanter ion beam. By using MOSFETs with different channel lengths larger increments may be used to determine dosage uniformity variations over the wafer on a more global scale.

DESCRIPTION OF THE PREFERRED EMBODIMENTS

In a preferred embodiment of this invention a p-type <100> oriented monocrystalline silicon wafer is provided. The wafer is first implanted with dopant ions of arsenic. Alternately phosphorous or antimony ions may be implanted. The wafer is mounted in an commercial ion implanter, for example, the NOVA Model 6200A manufactured by the Eaton Corporation, Semiconductor Equipment Operations, Implant Systems Division, 55 Cherry Hill Drive, Beverly, Mass. 01915-1053. The wafer is mounted on the stage of the implanter and aligned to the wafer flat thereby aligning the path of the ion implanting beam with respect to the crystal orientation of the wafer.

Figure 1:
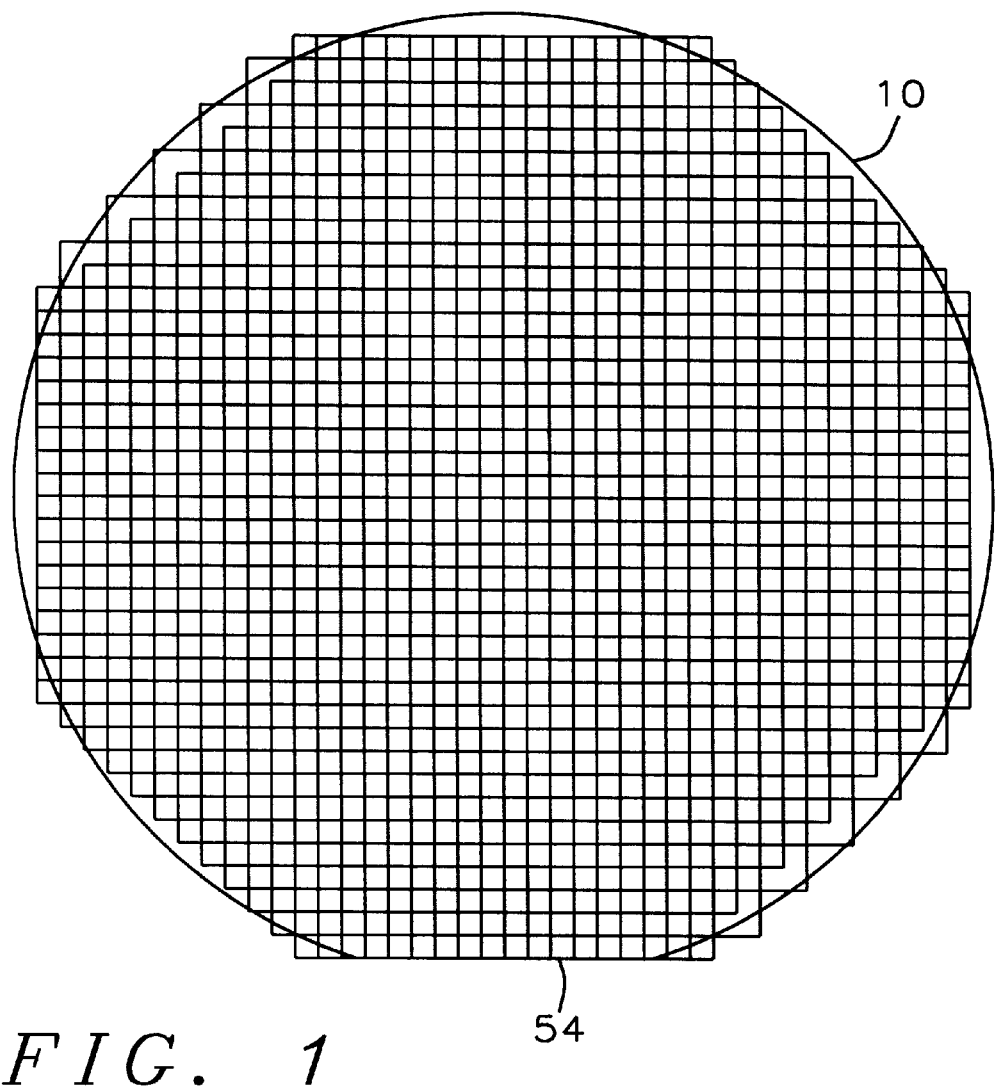
FIG. 1 is a plan view of a silicon wafer showing the scanning paths followed by the beam of a ion implanter

A blanket implantation of the surface of the test wafer is performed whereby the ion beam is electrostatically swept across the wafer, first in a direction parallel to the wafer flat and then in a direction perpendicular to the wafer flat. FIG. 1 is a plan view of the surface of wafer 10 showing the trace of a single pass scan pattern of an ion implant beam. The scan directions run parallel and perpendicular to the wafer flat 54. In practice multiple scans are employed to further fill in the regions within the squares of the first scan. Each successive scan is displaced from the preceding scan by an increment in both directions. In the current embodiment about 900 scans are employed forming a final scan pattern 900 times as dense as that shown in FIG. 1. Note that the dosage applied at each intersection is twice that of the dosage along the scanning path. After the final scan the distance between adjacent scan lines is about 4 microns.

For the purpose of determining the uniformity of implanted arsenic on the test wafer 10, the ions are implanted at an energy of between about 120 and 180 keV and at a nominal dosage of between about $7\times10^{12}$ and $9.5\times10^{12}$ ions/cm$^2$. After the implantation has been completed, the implanted arsenic ions are activated and driven in by a thermal anneal forming an n-type well. Activation and drive-in annealing to form a n- or p- type region or well in a semiconductor wafer of opposite conductive type is a procedure well known in the art.

Figure 2A:
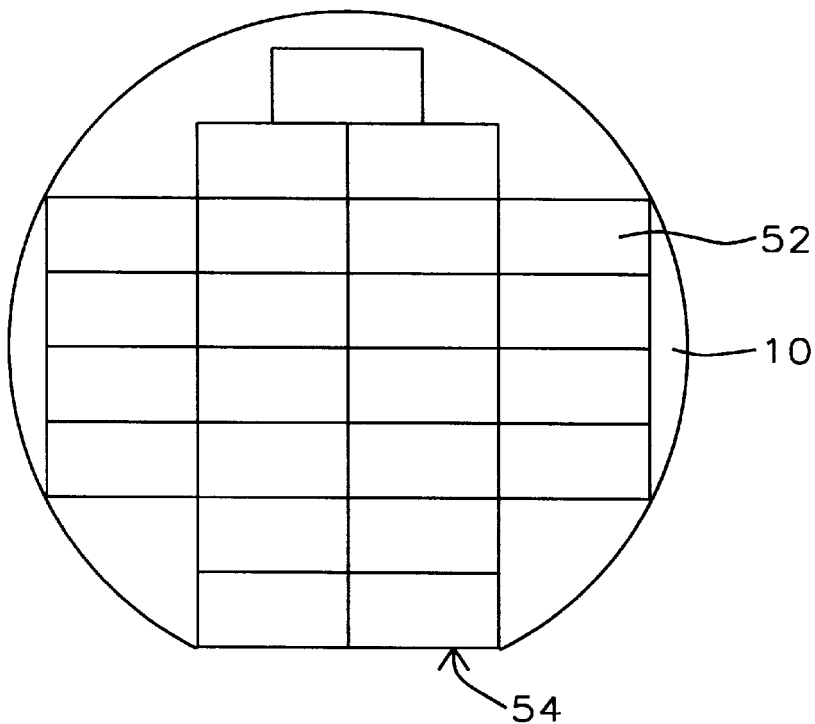
FIG. 2 is a plan view of a silicon wafer showing a wafer map of dopant uniformity test dice and an expanded view of one of the test dice showing an arrangement of arrays of test structures as used in the current invention.
Figure 2B:
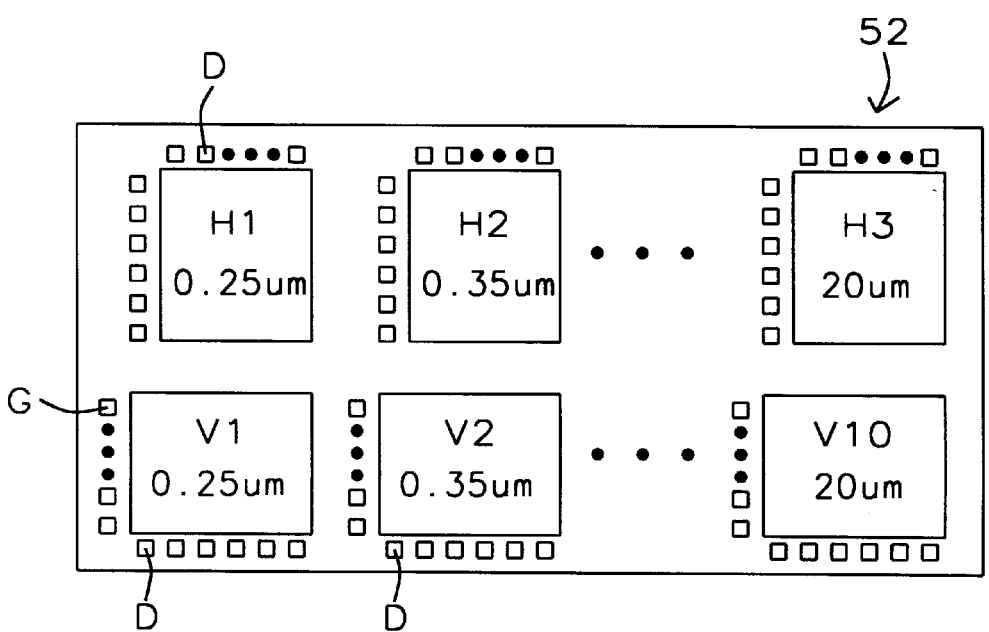

The implant uniformity test structures containing arrays of p-channel MOSFETs are then formed within the n-well 12. The threshold voltages of these MOSFET arrays reflect the doping profile of the n-well implant. The test structures are patterned in a conventional die(chip) format and are patterned using a stepper. A wafer map 50 showing a typical arrangement of test dice 52 patterned on wafer 10 is shown in FIG. 2. Beneath the wafer map 50 is shown a more detailed view of one of the test dice 52.

In the current embodiment, twenty arrays of MOSFETs are arranged on each test die. Each array contains one hundred or thereabout self-aligned polysilicon gate MOSFETs arranged in rows and skewed columns in such a manner that the channel regions form cross sectional increments of the implantation scan paths. In the set of arrays H1 through H12, the channel lengths of the MOSFETs are aligned in a direction perpendicular to the wafer flat while in the set of arrays V1 through V12 the channel lengths are aligned in a direction parallel to the wafer flat. The channel widths of all the MOSFETs in all the arrays is fixed and in this embodiment is selected at 20 microns or thereabout. The probe pads D are connected to the source/drain elements of the MOSFETs ans the probe pads G connect to the MOSFET gates.

Each of the arrays comprises an arrangement of MOSFETs having a specified channel length. In the current embodiment the array H1, for example, comprises an arrangement of MOSFETs having a channel length of 0.25 microns aligned perpendicular to the wafer flat while the array V12 comprises an arrangement of MOSFETs with a channel length of 20 microns aligned parallel to the wafer flat. A workable set of channel lengths is assigned to the arrays H1 through H12 and V1 through V12. In the current embodiment channel lengths of 0.25, 0.35, 0.5, 0.6, 0.8, 1.0, 1.2, 1.5, 2.0, 5.0, 10.0, and 20.0 are assigned to the twelve arrays of each channel orientation group. Obviously other sets of values may be used without departing from the spirit and scope of the invention. The values chosen are typically commensurate with the dimensions of the instant technology and with the characteristic parameters of the ion implantation process. More or fewer channel lengths may also be used depending upon the available space allotted by the die size.

Figure 3:
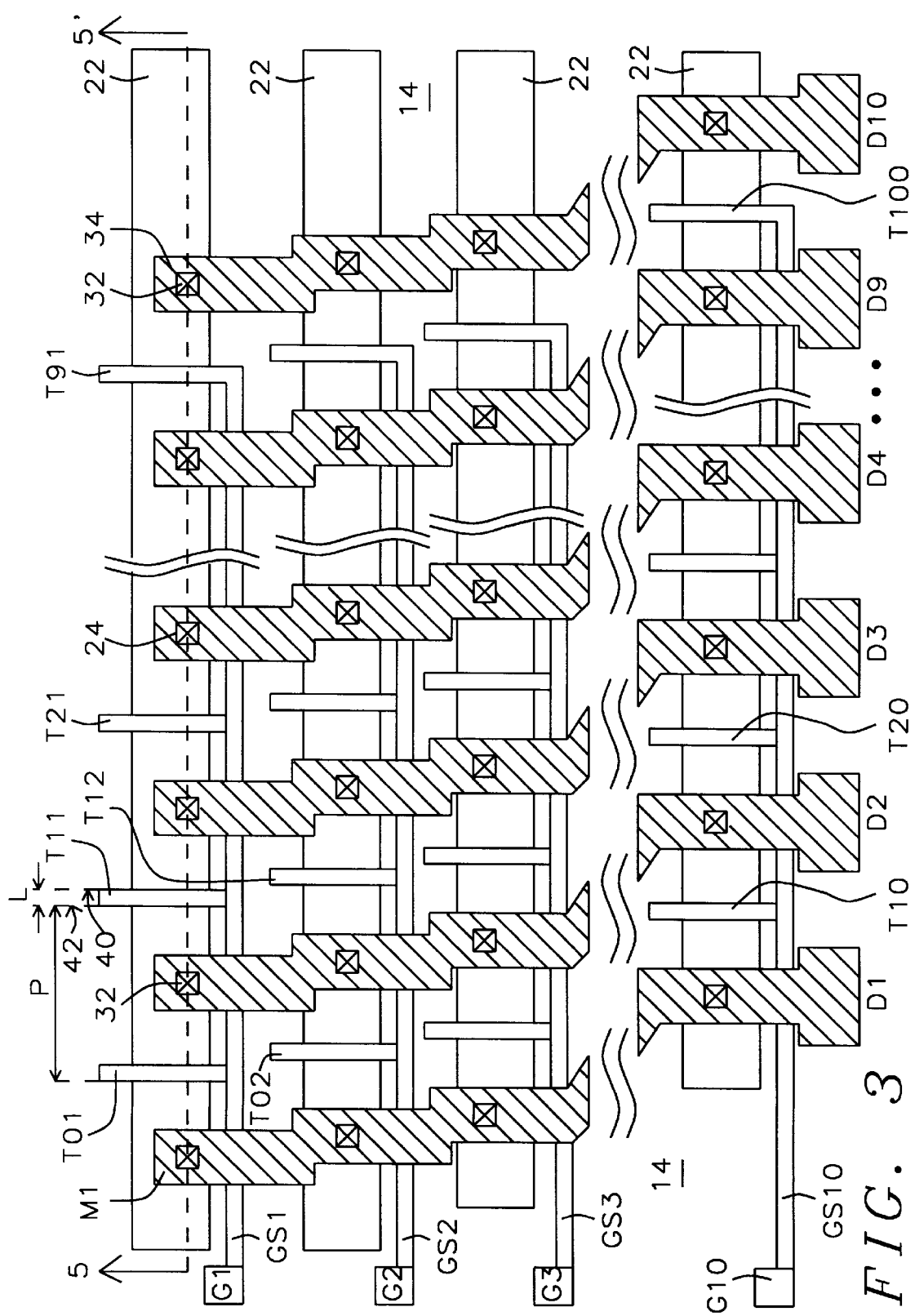
FIG. 3 is a plan view of one of the arrays of test structures used in the embodiments of this invention and showing the detailed elements of the devices.

The arrangement of the MOSFETs in the individual arrays is a key element of the current invention and is shown in detail by FIG. 3 where the array V2 is shown. The array V2 comprises MOSFETs with channel lengths of 0.35 microns aligned in a direction parallel to the wafer flat. The channel length is determined by the width L of the gate electrode. Referring to FIG. 3, the MOSFETs are formed in the active silicon areas 22 which are surrounded by field oxide isolation 14. In the figure the gates are numbered successively down the columns for reasons which will become apparent when their arrangement with respect to the ion implantation beam is later disclosed. The polysilicon gates T01, T11, T21 . . . T91 overlie the channel regions of the MOSFETs within the silicon active area 22 which is doped by the ion implantation alone.

The portions of the active area 22 not covered by a polysilicon gate receive an additional ion implant, forming the source/drain elements of the MOSFETs which are connected by contacts 32 to metal stripes M1 through M10 terminating at probe pads D1 through D10. The polysilicon gates T01, T11, T21 . . . T91 are interconnected by a polysilicon gate stripe GS1 and are terminated at a gate probe pad G1. Gate probe pad G2 is similarly connected to the gates of the MOSFETs in the second row of the array V2 by polysilicon gate stripe GS2 and so on through gate probe pad GIO which connects to the gates in the last row.

The arrangement of the polysilicon gate electrodes along the column direction is staggered in the sense that the gate electrode in each row is offset by one gate electrode width (channel length) from the gate electrode in the row immediately above it. This is illustrated in FIG. 3 by the dashed line 40 which runs parallel to the ion beam scan direction. The dashed line 40 falls along the right edge of the gate electrode T11 in the row serviced by the probe pad G1 and along the left edge of the gate electrode T12 in the next lower row serviced by the probe pad G2. This pattern is continued through successive rows thereby providing contiguous sampling increments of the cross section of the ion beam path.

The dotted line 42 extends vertically through the array, beginning along the left edge of the gate electrode T11, aligned parallel to the ion beam scanning path, down to along the right edge of the gate electrode T10 in the row serviced by the probe pad G10. In this embodiment the periodic spacing P between the gate electrodes in a row is equal to ten times the channel length L (the gate electrode width). It should be understood that the periodicity of 10 is for illustrative purposes only and that the periodicity of the gate electrodes can be of another multiple of the channel length.

As a practical rule, the periodicity should be an integral multiple of the channel length. The multiple should preferably be sufficiently large that the product of the multiple and the channel length is greater than the spot size. This then enables measurement of the spot size. Depending upon the actual spot size, which could be of the order of millimeters, the periodic spacing P could be of the order of hundreds, depending upon the channel length of the constituent transistors. Not only is such a test structure capable of accurately measuring the lateral cross section of the scanning beam spot but, the uniformity of the beam within the spot may also be ascertained by observation of the uniformity of the measured threshold voltages of the transistors in the beam path. It should be apparent to one skilled in the art that the resolution of such a beam uniformity and spot size measurement would increase as the channel length of the component transistors decreases.

The metal stripes M1 through M10 interconnect the source/drain elements along the columns of the array through contacts 32.and are terminated at source/drain probe pads D1 through D10 along the base of the array. Each MOSFET in the array can be selectively tested by applying test voltages to one of the gate probe pads and to adjacent source/drain probe pads. For example, by applying a voltage between source/drain probe pads D3 and D4 and a second voltage on the gate probe pad G1, a current can be measured in the channel under gate T21. By measuring the current voltage (I-V) characteristic of the channel at several gate voltages, the threshold gate voltage $V_T$ can be determined by extrapolation. The threshold gate voltage is directly related to the concentration of active dopant in the channel region and consequently is a measure of the implant dosage in that region. See for example Wolf, S. and Tauber, R. N., "Silicon Processing for the VLSI Era", Vol.1, Lattice Press. Sunset Beach, Calif. (1986), p325.

Figure 4:
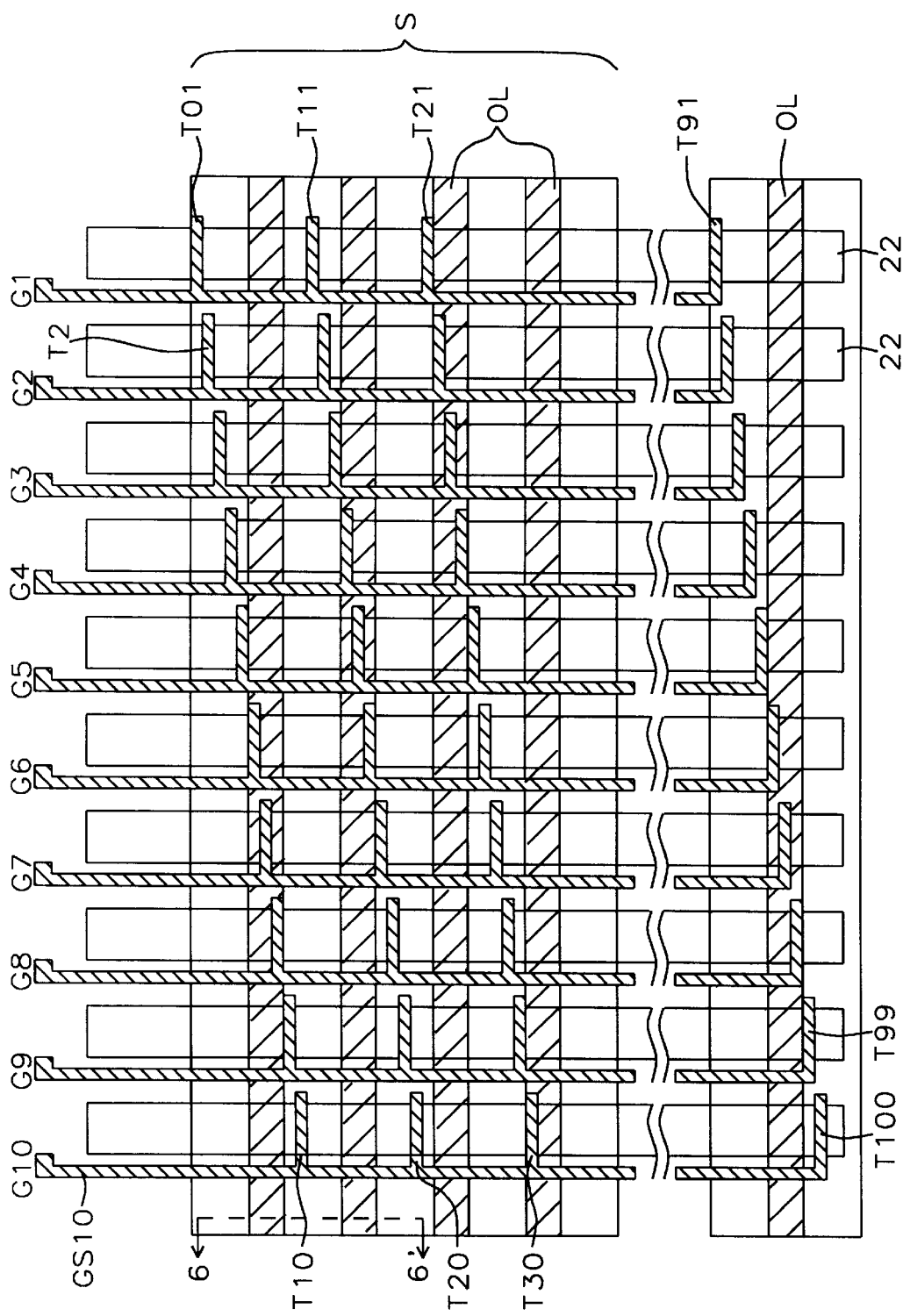
FIG. 4 is a plan view showing a portion of the scan pattern of an ion implanting beam over a portion of one of the test structures disclosed by this invention.

FIG. 4 serves to further illustrate the relationship between the location and orientation of the MOSFET channel regions of the test structure with respect to the scanning paths of the ion implanter. In FIG. 4 there are shown the gate electrodes T01 through T100 with their respective interconnecting stripes GS1 through GS9 to gate probe pads G1 through G10 and the active areas 22. It will now be apparent that the gate numbering sequence is chosen to reflect the sequence of increments proceeding across the scanning paths from left to right. The dopant concentrations derived from the measured gate threshold voltages can then be plotted in the order of the gate numbering to provide the desired dopant profile. The region S indicates the paths traveled by five parallel ion beam scans with the hatched regions OL indicating overlap of adjacent scans.

Figure 5A:
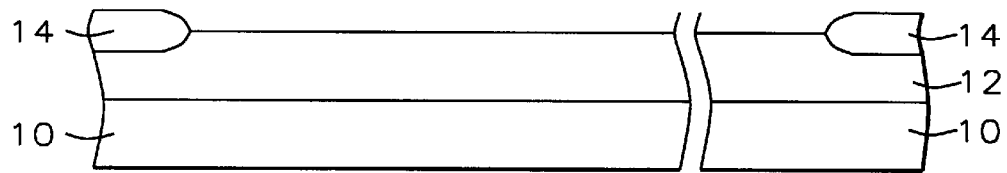
FIG. 5A through FIG. 5C are cross sections of a portion of FIG. 3. showing the process steps for forming the test structures of disclosed by this invention.
Figure 5B:
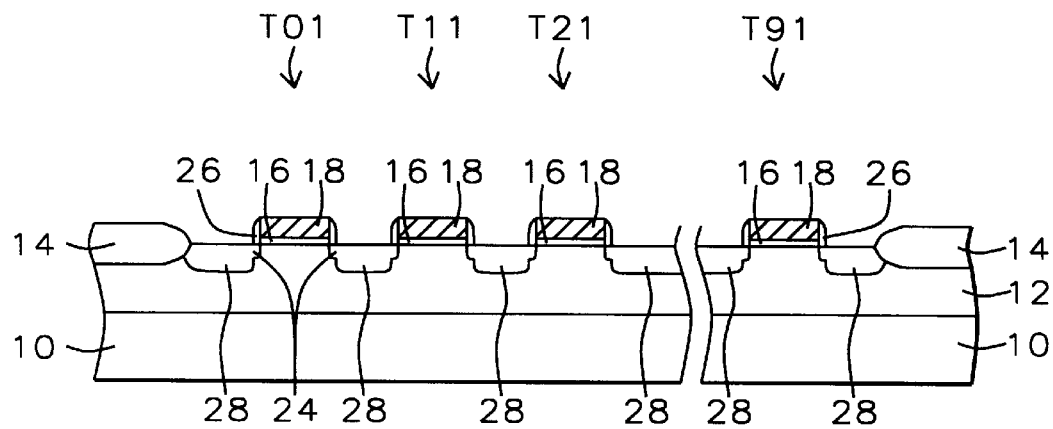
Figure 5C:
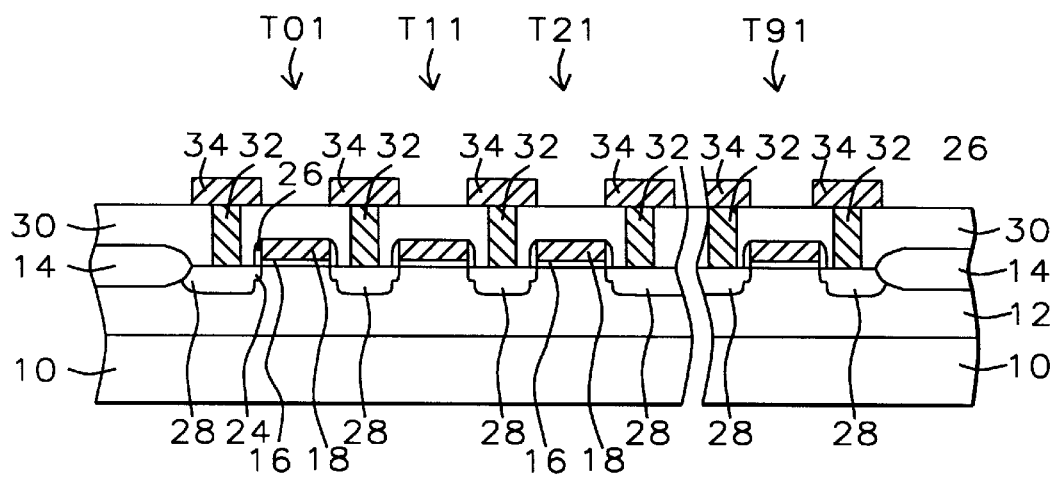

FIGS. 5A through 5C are cross sections of the test wafer taken along the line 5–5' of FIG. 3. These figures illustrate the processing steps used to form the p-channel MOSFET arrays which comprise the dopant uniformity test structures. Four photolithographic patterning steps are required to form the test structures. Test structures are formed on all the die sites on the wafer map so that the entire useable area of the wafer surface may be profiled. The first patterning step defines the silicon active areas in the silicon nitride LOCOS hardmask.

Referring first to FIG. 5A, the wafer 10 is shown after the test ion implanted layer 12 has been formed by scanning the wafer 10 with an arsenic ion beam. The arsenic ions are implanted at an energy of between about 120 and 180 keV and at a nominal dosage of between about $7 \times 10^2$ and $9.5 \times 10^{12}$ ions/cm$^2$. After the implantation has been completed, the implanted arsenic ions are activated and driven in by a thermal anneal forming an n-type well. Activation and drive-in annealing to form a n- or p- type region or well in a semiconductor wafer of opposite conductive type is a procedure well known in the art.

A field oxide isolation 14 is next patterned and formed on the wafer 10. The field oxide isolation 14 is formed by the familiar LOCOS(local oxidation of silicon) method whereby a pad oxide is thermally grown on the wafer and a layer of silicon nitride is deposited. The details for the formation of the field oxide isolation 14 are not shown because the method is well known and widely practiced in the art. The silicon nitride layer is photolithographically patterned and etched by RIE (reactive ion etching) to form an oxidation hardmask. The wafer is then thermally oxidized to form a field oxide enclosing an island 22 of active silicon in which the active elements of the test structures are subsequently formed. FIG. 3 shows the active silicon islands 22 in plan view.

Referring now to FIG. 5B, a gate oxide 16 is formed over the silicon active area 22 by thermally oxidation. A layer of conductive polysilicon 18 is deposited over the gate oxide 16 by low pressure chemical vapor deposition(LPCVD) and patterned by a second mask to form the gate electrodes T01, T11, T21 . . . T91 which are interconnected by a polysilicon stripe external to the cross section and terminated at probe pad G1 shown in the plan view in FIG. 3. The method for forming polysilicon gate electrodes is well known and well understood by those skilled in the art. The gate electrodes may be of a composite construction having, for example, a layer of doped polysilicon over a layer of undoped polysilicon. Their construction may also include other materials, for example a refractory metal silicide formed over polysilicon.

After patterning the gate electrodes T01, T11, T21 . . . T91, source/drain elements 28 with LDD (lightly doped drain) regions 24 are formed by implantation of boron or $BF_2^+$ions before and after the formation of sidewall spacers 26. The procedures for forming source/drain regions 28 with LDD regions 24 including the selection of dopant concentrations are well known in the art. Although the test structures of this embodiment may be formed without LDD regions 24, it is preferable to include the LDD regions 24 to reduce errors caused by short channel effects in devices with channel lengths of less than about one micron. For the study of ion beams with large spot size using MOSFETs with channel lengths of 0.8 microns or greater, the incorporation of the LDD regions 24 with their accompanying sidewall spacers 26 may be omitted.

Referring now to FIG. 5C, an insulative layer 30 is next deposited over the wafer 10 preferentially by LPCVD. The layer is formed of silicon oxide or of a composite of silicon oxide and with a superjacent layer of borophosphosilicate glass (BPSG). Other insulative materials, for example organic low dielectric constant materials may alternatively be used in the formation of the insulative layer 30. Contact openings are etched in the layer 30 and a contact metallurgy, for example tungsten plugs 32 are formed. The procedures for forming plug contacts to semiconductive elements are well known to those in the art. The mask for defining the contact is the third mask required in the embodiment. A metal layer, for example aluminum, is next deposited over the insulative layer 30 and patterned using a fourth and final mask, forms metal stripes 34 which interconnect the source/drain regions of the MOSFETs serviced by the gate electrodes T01, T11, T21 . . . T91 to other MOSFETs along the columns of the array and terminated them at probe pads D1 through D10 as depicted by FIG. 3.

The test structures are now completed and are ready for electrical testing which includes the measurement of the gate threshold voltage. The test wafer 10 is next mounted on the stage of a mechanical probe station and threshold voltages of selected MOSFETs are measured and recorded.

The threshold measurements are performed on each array in a column-wise manner. Referring to FIG. 3, the threshold voltages of transistors serviced by gate electrodes T01 through T10 are first measured by connecting the substrate wafer 10 and the common source D2 ground. A voltage, for example 0.1 Volt is applied to the common drains on the pad D1. Next a voltage ramp is applied to the gate electrode T01 via the probe pad G1. The range and rate of the voltage ramp is selected according to procedures well known by those skilled in the art. The drain current is then measured as a function of the applied gate voltage. The threshold voltage then determined as the voltage on the gate when the variation of the drain current with gate voltage is equal to zero.

After measurement and recording of the data on the transistor gate T01, the gate voltage probe is moved to pad G2 and the procedure is repeated to measure the threshold voltage of transistor serviced by the gate electrode T02. When the first column of gate have been measured, the applied source/drain voltage is moved from between D1 and D2 to between D2 and D3 and the procedure is repeated to measure the transistors in the second column. The procedures is again repeated until the entire array has been measured.

Each array of the various channel lengths and directional orientation is measured in a similar fashion and the date recorded. By using computer automation and simple algorithms the data can be quickly collected and reduced to provide threshold voltage vs. gate position plots which display dopant profile trends. In addition the mean and standard deviations of the data sets are computed by well known statistical methods. Graphing of the data to show profiles is accomplished by plotting the measurements of the transistors in the positional sequence of their gates.

Figure 6:
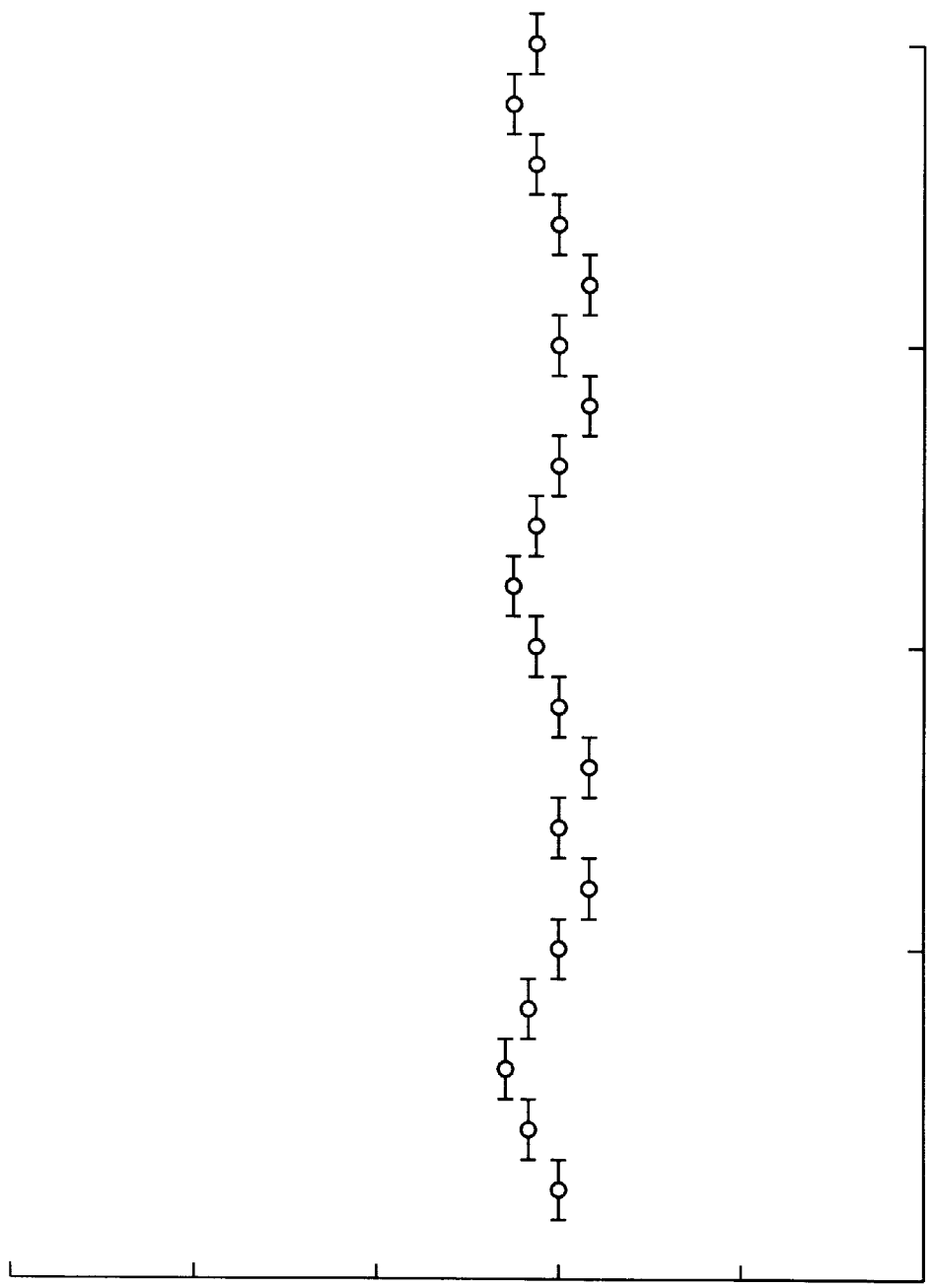
FIG. 6 is a graph showing a hypothetical ion implanted dopant concentration profile measured across three overlapping ion implantation beam scans using the test structures and the method disclosed by this invention.

FIG. 6 shows a hypothetical profile of the threshold voltage as a function of the gate electrode number representing a dopant profile measured on a the test structure of the current invention along the line 6–6' of FIG. 4 crossing three overlapping ion implantation beam scans. Because the numbering of the gate electrodes is ordered with respect to the sequence of gates(channels) along the cross section of the ion beam scans, the gate electrode index multiplied by the channel length becomes the linear distance.

The peaks and valleys in FIG. 6 give a profile of the doping uniformity across an ion implantation scan matrix to a resolution which is equal to the channel length of the MOSFETs in the particular array which is tested. For an array of 0.25 micron channel length MOSFETs, measurement of the 100 MOSFETs in the array shown in FIG. 4 will detail the uniformity over a distance of 25 microns. Similarly by using an array with 20 micron channel length MOSFETs, the doping uniformity of a section 2 millimeters in length can be measured with the same number of threshold voltage measurements. By measuring only the larger channel length arrays in each of the test structure dice, the entire wafer can be globally profiled.

In practice, the threshold voltage profiles are not as orderly or periodic as the profile illustrated in FIG. 6. Actual profiles obtained according to the method of this invention are more complex and are capable of revealing the condition of the implanting tool with regard to tuning and calibration. In addition, the profiles may be used to indicate and monitor tuning procedures, such a beam defocussing and alignment. It is observed that the when an implanting tool put into service after maintenance, the ion beam spot is initially very uniform. As production usage proceeds the uniformity of the ion beam spot steadily degrades. The test structures described in this invention can be used to provide an explicit measurement of this degradation, and thereby provide a suitable implantation process monitoring vehicle.

Figure 7:
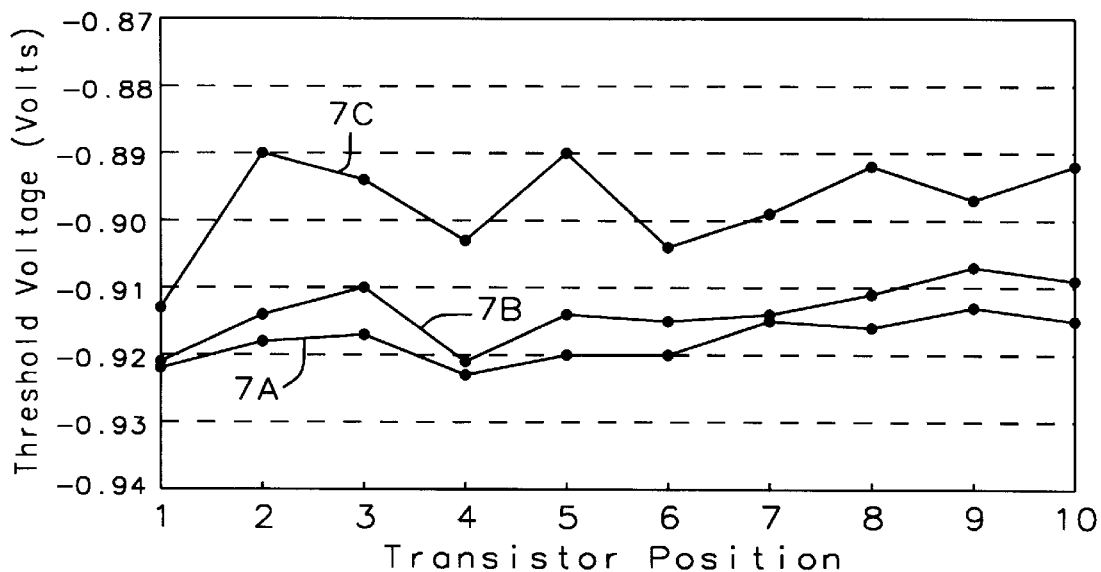
FIG. 7 is a graph showing threshold voltage profiles obtained with a typical un-tuned ion implanter using the test structures and measurement methods taught by this invention.

FIG. 7 is a graph showing the threshold voltage profiles obtained on a typical implanter without extra fine tuning or degradation. Curve 7A is data taken from MOSFETs with a 20 micron channel length. Curve 7B, taken on 0.6 micron channel length devices, is somewhat more erratic but still close to the longer channel length devices. Curve 7C, showing data from MOSFETs with a 0.5 micron channel length, is considerably more erratic and displaced from the other curves. All MOSFETs have a channel width of 20 microns.

When the implanter was deliberately fine tuned to de-focus the ion beam, the dopants distributed more uniformly. This is illustrated by the curves shown in FIG. 8. where the curve 8C, representing 0.5 micron channel length devices shows improved uniformity. Curves 8A and 8B represent 10 and 0.6 micron channel length MOSFETs. All MOSFETs have a channel width of 20 microns.

Figure 9:
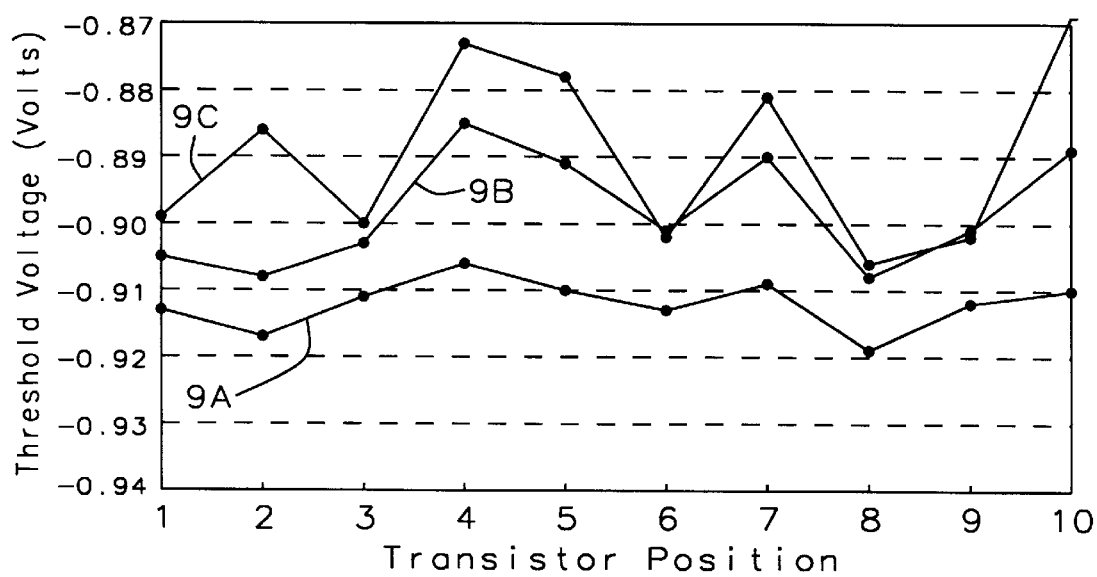
FIG. 9 is a graph showing threshold voltage profiles obtained with an ion implanter in a degraded condition using the test structures and measurement methods taught by this invention.

The profile curves shown in FIG. 9 were measure on test structures implanted with an implanter in a degraded condition where the ion beam was not stable. The curves 9A, 9B, and 9C again represent test structures with 10, 0.6, and 0.5 micron channel length devices respectively. All MOSFETs have a channel width of 20 microns.

Figure 8:
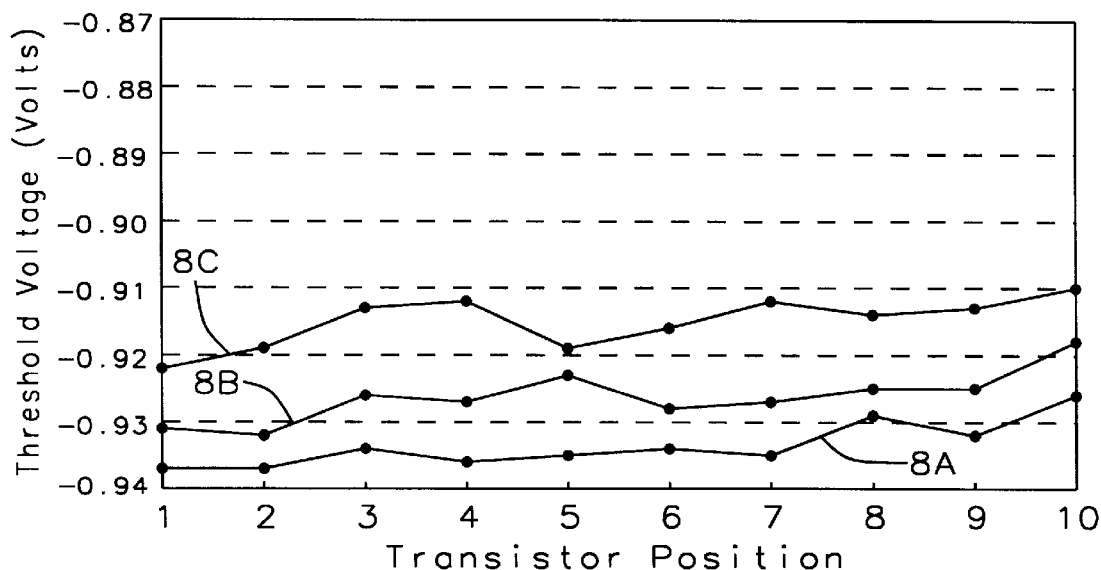
FIG. 8 is a graph showing threshold voltage profiles obtained with a tuned ion implanter using the test structures and measurement methods taught by this invention.

Note that in FIGS. 7 through 9, the linear distance covered by each of the three curves is not the same. The curves B and C, representing the shorter channel transistors cover a much smaller linear distance than the A curves and show the more localized variations of the threshold voltage.

While this invention has been particularly shown and described with reference to the preferred embodiments thereof, it will be understood by those skilled in the art that various changes in form and details may be made without departing from the spirit and scope of the invention.

While the embodiments of this invention utilize a p-type silicon substrate, an n-type silicon substrate could also be used without departing from the concepts therein provided. The test structures and method of measurement are also not limited to arsenic implantation but may also be applied with any p- or n-type dopant impurities which can be ion implanted.

What is claimed is:

1. A test chip for measuring the concentration uniformity of an ion implanted dopant impurity in a semiconductor wafer comprising:
   (a) A plurality of arrays of self aligned gate MOSFETs formed on a semiconductor wafer having an ion implanted dopant impurity, wherein the channel lengths of said MOSFETs are aligned in a direction perpendicular to the direction of travel of an ion implantation beam; and
   (b) wherein each of said plurality of arrays further comprises a matrix of rows and columns of MOSFETs with a single channel length and a gate electrode spacing which is unique to each said matrix; and
   (c) wherein the MOSFETs in each row of said matrix of rows are formed over a common active area with gate electrodes extending across said common active area with a fixed center-to-center spacing between said gate electrodes being interconnected in a comb-like pattern terminating at a probe pad exterior to said matrix;
   (d) wherein the source/drain elements of said MOSFETs are formed in spaces between said gate electrodes said source/drain elements interconnected along the columns of said matrix by conductive contacts and metal interconnections terminating at probe pads exterior to said matrix; and
   (e) wherein the gate electrodes in each successive row of said matrix, are of the same said fixed center-to-center spacing as those in the preceding row and are offset along the channel direction from those of the preceding row to an extent that the right hand end of a MOSFET channel in the ith row of said matrix aligns with the left hand end of a MOSFET channel in the (i+1)th row of said matrix.

2. The test chip of claim 1 wherein said fixed center-to-center spacing between said gate electrodes is an integer multiple of the channel length of said MOSFETs.

3. The test chip of claim 1 wherein the channel lengths of said MOSFETs are between 0.2 and 20 microns.

4. The test chip of claim 1 wherein said plurality of arrays contains at least one array with channel lengths aligned perpendicular to channel lengths of MOSFETs in at least one other array on said test chip.

5. The test chip of claim 1 wherein the number of rows in each matrix is at least equal to the center to center spacing of said gate electrodes in said matrix divided by the channel length of MOSFETs in said matrix.

* * * * *